(12) United States Patent
Nakata et al.

(10) Patent No.: US 10,367,998 B2
(45) Date of Patent: Jul. 30, 2019

(54) METHOD FOR CONTROLLING IMAGING DEVICE, AND IMAGING DEVICE

(71) Applicant: Panasonic Intellectual Property Management Co., Ltd., Osaka (JP)

(72) Inventors: Manabu Nakata, Osaka (JP); Shinichi Machida, Osaka (JP); Takeyoshi Tokuhara, Osaka (JP); Sanshiro Shishido, Osaka (JP); Masaaki Yanagida, Kyoto (JP); Masumi Izuchi, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 6 days.

(21) Appl. No.: 15/871,978

(22) Filed: Jan. 15, 2018

(65) Prior Publication Data
US 2018/0227490 A1 Aug. 9, 2018

(30) Foreign Application Priority Data
Feb. 3, 2017 (JP) ................................. 2017-018764

(51) Int. Cl.
| H04N 5/232 | (2006.01) |
| H04N 5/235 | (2006.01) |
| H04N 9/07 | (2006.01) |
| H04N 5/33 | (2006.01) |
| H04N 9/04 | (2006.01) |
| H01L 27/30 | (2006.01) |

(52) U.S. Cl.
CPC ....... *H04N 5/23245* (2013.01); *H04N 5/2351* (2013.01); *H04N 5/332* (2013.01); *H04N 9/04553* (2018.08); *H04N 9/07* (2013.01); *H01L 27/307* (2013.01)

(58) Field of Classification Search
CPC .. H04N 5/23245; H04N 9/04553; H04N 9/07; H04N 5/2351; H04N 5/332; H01L 27/307
See application file for complete search history.

(56) References Cited

U.S. PATENT DOCUMENTS

| 9,386,230 | B1 * | 7/2016 | Duran | ................. H04N 5/2351 |
| 2013/0155254 | A1 | 6/2013 | Kanto et al. | |
| 2015/0207087 | A1 | 7/2015 | Udaka et al. | |
| 2016/0307326 | A1 * | 10/2016 | Wang | ..................... G01B 11/22 |
| 2017/0006226 | A1 * | 1/2017 | Chino | ................ H04N 5/23245 |

(Continued)

FOREIGN PATENT DOCUMENTS

| JP | 4-104671 | 4/1992 |
| JP | 2008-227092 | 9/2008 |

(Continued)

*Primary Examiner* — Shahbaz Nazrul
(74) *Attorney, Agent, or Firm* — McDermott Will & Emery LLP

(57) ABSTRACT

A method is for controlling an imaging device that allows switching of an operation mode between a first mode to perform imaging in a first imaging wavelength band and a second mode to perform imaging in a second imaging wavelength band different from the first imaging wavelength band. The method includes: determining whether ambient light includes near-infrared light based on information obtained in the first mode and information obtained in the second mode; and maintaining or changing the operation mode.

11 Claims, 8 Drawing Sheets

(56) References Cited

U.S. PATENT DOCUMENTS

| | | | | |
|---|---|---|---|---|
| 2017/0041524 A1* | 2/2017 | Schoenen | .......... | H04N 5/23206 |
| 2017/0374282 A1* | 12/2017 | Naruse | .................. | G03B 15/00 |
| 2018/0120661 A1* | 5/2018 | Kilgore | .................. | G02F 1/155 |
| 2018/0180783 A1* | 6/2018 | Hjelmstrom | ............. | G03B 9/06 |
| 2018/0270418 A1* | 9/2018 | Lin | .................... | H04N 5/23245 |
| 2018/0316859 A1* | 11/2018 | Saenger Nayver | .... | H04N 5/332 |

FOREIGN PATENT DOCUMENTS

| | | |
|---|---|---|
| JP | 2009-005061 | 1/2009 |
| JP | 2011-015086 | 1/2011 |
| JP | 2013-128259 | 6/2013 |
| JP | 2013-247492 | 12/2013 |
| JP | 2014-531080 | 11/2014 |
| WO | 2013/055777 | 4/2013 |
| WO | 2014/024581 | 2/2014 |

\* cited by examiner

|  | RGB MODE | RGB+IR MODE |
|---|---|---|
| WITHOUT IR ILLUMINATION | IR INCLUDED IN AMBIENT LIGHT (UNDER SUNLIGHT) $\alpha > \beta$ | — |
| WITH IR ILLUMINATION | — | AMBIENT LIGHT EQUAL TO OR LOWER THAN NOISE LEVEL (ILLUMINANCE DETERMINED TO BE INSUFFICIENT) $\alpha < \beta$ |

METHOD FOR CONTROLLING IMAGING DEVICE, AND IMAGING DEVICE

BACKGROUND

1. Technical Field

The present disclosure relates to an imaging device that allows switching between two different imaging modes, and a method for controlling the imaging device.

2. Description of the Related Art

For applications such as security cameras and vehicle-mounted cameras used to assist in safe driving, there is a demand for imaging devices that have sensitivity to, in addition to visible light, light in the near-infrared or infrared region with wavelengths longer than those of visible light. In contrast, to reduce mixing of colors in the near-infrared range into a visible image, an infrared cut-off filter (IR cut-off filter) is disposed in conventional sensors to remove near-infrared light. For imaging devices designed to perform imaging using near-infrared light in addition to visible light, however, such an IR cut-off filter may not be used because using an IR cut-off filter renders such imaging using near-infrared light impossible. For this reason, to obtain both visible light and near-infrared light by means of a single sensor, a sensor capable of controlling its sensitivity to each of these wavelengths of light is desired.

With a view to achieving such a sensor, for example, International Publication No. 2014/024581 and Japanese Unexamined Patent Application Publication No. 2008-227092 each disclose a sensor formed by a stack of photoelectric conversion materials with different wavelength sensitivities to allow the sensitivity of the sensor to be controlled by voltage. Japanese Unexamined Patent Application Publication No. 2009-005061 discloses an image sensor with a photodiode whose spectral sensitivity is changed by application of voltage.

SUMMARY

One non-limiting and exemplary embodiment provides a method for controlling an imaging device that allows easy switching between imaging wavelength bands.

In one general aspect, the techniques disclosed here feature a method for controlling an imaging device that allows switching of an operation mode between a first mode to perform imaging in a first imaging wavelength band and a second mode to perform imaging in a second imaging wavelength band different from the first imaging wavelength band. The method includes, when the operation mode is the first mode, determining whether ambient light includes near-infrared light based on information obtained in the first mode and information obtained in the second mode, maintaining the first mode when the ambient light includes near-infrared light, and switching the operation mode to the second mode when the ambient light does not include near-infrared light. The method further includes, when the operation mode is the second mode, determining whether ambient light includes near-infrared light based on information obtained in the first mode and information obtained in the second mode, switching the operation mode to the first mode when the ambient light includes near-infrared light, and maintaining the second mode when the ambient light does not include near-infrared light.

It should be noted that general or specific embodiments may be implemented as an element, a device, an apparatus, a system, an integrated circuit, a method, or a computer program, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
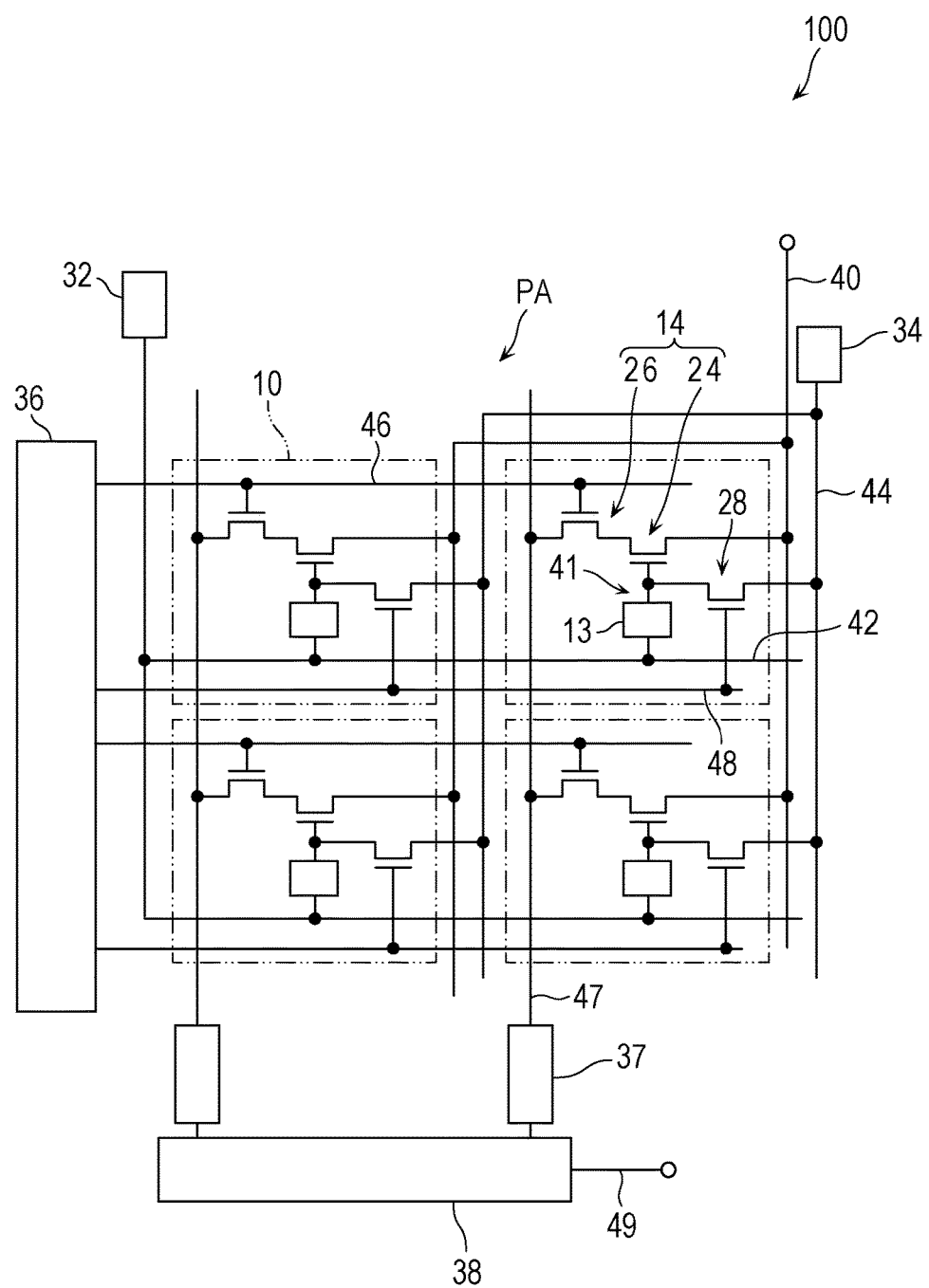
FIG. 1 schematically illustrates an exemplary circuit configuration of an image sensor according to an embodiment.

Neither International Publication No. 2014/024581 nor Japanese Unexamined Patent Application Publication No. 2008-227092 describes a control method that involves switching of imaging wavelength bands and imaging sensitivities. Although Japanese Unexamined Patent Application Publication No. 2009-005061 discloses automatically switching these features according to the output of a luminance meter that is separately provided, this approach disadvantageously requires use of a luminance meter. Accordingly, the present inventors have made intensive studies in order to provide a method for controlling an imaging device that allows easy switching between imaging wavelength bands, or such an imaging device.

According to one aspect of the present disclosure, a method is provided for controlling an imaging device that allows allowing switching of an operation mode between a first mode and a second mode. The first mode is a mode for the imaging device to perform imaging in a first imaging wavelength band, and a second is a mode for the imaging device to perform imaging in a second imaging wavelength band different from the first imaging wavelength band. The method includes, when the operation mode is the first mode, determining whether ambient light includes near-infrared light based on information obtained in the first mode and information obtained in the second mode, maintaining the first mode when the ambient light includes near-infrared light, and switching the operation mode to the second mode when the ambient light does not include near-infrared light. The method further includes, when the operation mode is the second mode, determining whether ambient light includes near-infrared light based on information obtained in the first mode and information obtained in the second mode, switching the operation mode to the first mode when the ambient light includes near-infrared light, and maintaining the second mode when the ambient light does not include near-infrared light.

The method configured as described above makes it possible to determine whether ambient light includes near-infrared light based on information obtained in the first mode and information obtained in the second modes, and switch the operation mode in accordance with the result of the determination. The method allows easy switching between imaging wavelength bands.

In one exemplary implementation, the first imaging wavelength band represents the visible-light region, and the second imaging wavelength band represents the visible-light region and the near-infrared region.

In one exemplary implementation, the switching the operation mode to the first mode is performed by applying a first voltage between a pixel electrode and a counter electrode of the imaging device. The switching the operation mode to the second mode is performed by applying a second voltage, different from the first voltage, between the pixel electrode and the counter electrode of the imaging device.

In one exemplary implementation, the determining of whether ambient light includes near-infrared light represents determining whether imaging is performed under sunlight.

In one exemplary implementation, the determining of whether ambient light includes near-infrared light is performed once every plurality of frames.

In one exemplary implementation, the determining of whether ambient light includes near-infrared light is made by comparing, with a predetermined threshold, the ratio between a signal obtained in the first mode and a signal obtained in the second mode.

In one exemplary implementation, the determining of whether ambient light includes near-infrared light is made by comparing, with a predetermined threshold, the ratio between the arithmetic mean of a plurality of pixel values included in an image obtained in the first mode and the arithmetic mean of a plurality of pixel values included in an image obtained in the second mode.

In one exemplary implementation, the threshold is the ratio between the sensitivity of the first mode and the sensitivity of the second mode.

According to one aspect of the present disclosure, an imaging device that allows switching of an operation mode between a first mode and a second mode is provided. In the first mode, the imaging device performs imaging in a first imaging wavelength band. In a second mode, the imaging device performs imaging in a second imaging wavelength band different from the first imaging wavelength band. The imaging device includes determination circuitry and mode switching circuitry. The determination circuitry, based on information obtained in the first mode and information obtained in the second mode, determines whether ambient light includes near-infrared light. The mode switching circuitry switches the operation mode to the first mode when the operation mode is the second mode and determination circuitry determines that ambient light includes near-infrared light, and switches the operation mode to the second mode when the operation mode is the second mode and determination circuitry determines that ambient light does not include near-infrared light.

Hereinafter, embodiments of the present disclosure will be described in detail with reference to the drawings. Embodiments described below each represent a general or specific example. Specific details set forth in the following description of embodiments, such as numeric values, shapes, materials, components, the arrangements and connections of components, steps, and the order of steps, are for illustrative purposes only and not intended to limit the scope of the present disclosure. Various aspects of the present disclosure discussed herein may be combined as long as these aspects do not contradict each other. Those components in the following description of embodiments which are not cited in the independent claim representing the most generic concept of the present disclosure will be described as optional components. In the following description, components having substantially the same function will be sometimes denoted by the same reference signs to avoid repetitive description.

Image Sensor

First, an image sensor 100 according to the embodiments will be described.

FIG. 1 illustrates an exemplary circuit configuration of the image sensor 100 according to an embodiment of the present disclosure. The image sensor 100 illustrated in FIG. 1 has a pixel array PA including a plurality of unit pixel cells 10 that are arranged two-dimensionally. FIG. 1 schematically illustrates an exemplary arrangement of the unit pixel cells 10 in a matrix with two rows and two columns. It is needless to mention that the number and arrangement of the unit pixel cells 10 in the image sensor 100 are not limited to those illustrated in FIG. 1.

Each unit pixel cell 10 has a photoelectric converter 13 and a signal detection circuit 14. As will be described later with reference to the drawings, the photoelectric converter 13 has a photoelectric conversion layer sandwiched between two opposing electrodes, and generates a signal charge in response to light incident on the photoelectric converter 13. The photoelectric converter 13 does not, in its entirety, need to be an element independent for each unit pixel cell 10 but a part or the entirety of the photoelectric converter 13 may extend over a plurality of unit pixel cells 10. Thus, the electrode on the incidence side may extends over some or all of the unit pixel cells 10.

The signal detection circuit 14 detects a signal generated by the photoelectric converter 13. In this example, the signal detection circuit 14 includes a signal detection transistor 24 and an address transistor 26. The signal detection transistor 24 and the address transistor 26 are typically field effect transistors (FETs). In this example, the signal detection transistor 24 is an N-channel metal oxide semiconductor (MOS), and the address transistor 26 is also an N-channel MOS.

As schematically illustrated in FIG. 1, the control terminal (the gate in this case) of the signal detection transistor 24 has an electrical connection with the photoelectric converter 13. A signal charge (a hole or an electron) generated by the photoelectric converter 13 is stored on a charge storage node (also referred to as "floating diffusion node" or "charge storage region") 41 between the gate of the signal detection transistor 24 and the photoelectric converter 13. A detailed structure of the photoelectric converter 13 will be described later.

The photoelectric converter 13 of each unit pixel cell 10 has a connection with a sensitivity control line 42. In the configuration illustrated in FIG. 1, the sensitivity control line 42 is connected to a voltage supply circuit 32. The voltage supply circuit 32 is capable of supplying at least three kinds of voltages, a first voltage, a second voltage, and a third voltage, to the photoelectric converter 13. During operation of the image sensor 100, the voltage supply circuit 32 supplies a predetermined voltage to the photoelectric converter 13 via the sensitivity control line 42. The voltage supply circuit 32 is not limited to a specific power circuit but may be a circuit that generates a predetermined voltage or may be a circuit that converts a voltage supplied from another power source into a predetermined voltage. As will be described later in detail, as the voltage supplied from the voltage supply circuit 32 to the photoelectric converter 13 is switched between a plurality of different voltages, the start or end of storage of signal charge from the photoelectric converter 13 onto the charge storage node 41 is controlled. In other words, according to an embodiment of the present disclosure, the voltage supplied from the voltage supply circuit 32 to the photoelectric converter 13 is switched between the third voltage and the other voltages to thereby execute an electronic shutter operation. An example of operation of the image sensor 100 will be described later.

Each unit pixel cell 10 has a connection with a power line 40 that supplies a power supply voltage VDD. As illustrated in FIG. 1, the power line 40 is connected with the input terminal (typically, the drain) of the signal detection transistor 24. With the power line 40 serving as a source-follower power source, the signal detection transistor 24 amplifies a voltage corresponding to the signal charge generated by the photoelectric converter 13, and outputs the resulting voltage as a signal voltage.

The output terminal (the source in this case) of the signal detection transistor 24 is connected with the input terminal (the drain in this case) of the address transistor 26. The output terminal (the source in this case) of the address transistor 26 is connected to corresponding one of a plurality of vertical signal lines 47 provided for respective columns of the pixel array PA. The control terminal (the gate in this case) of the address transistor 26 is connected to an address control line 46. Controlling the potential of the address control line 46 allows the output of the signal detection transistor 24 to be selectively read out to the corresponding vertical signal line 47.

In the illustrated example, address control lines 46 are connected to a vertical scanning circuit (also referred to as "row scanning circuit") 36. The vertical scanning circuit 36 applies a predetermined voltage to each address control line 46 to thereby select, on a row-by-row basis, a plurality of unit pixel cells 10 arranged in each row. Reading of signals from the selected unit pixel cells 10 is thus executed.

The vertical signal line 47 is a main signal line for transmitting a pixel signal from the pixel array PA to a peripheral circuit. The vertical signal line 47 is connected with a column signal processing circuit (also referred to as "row signal storage circuit") 37. The column signal processing circuit 37 performs processing such as noise suppression signal processing, which is typically represented by correlated double sampling, and analog-digital conversion (AD conversion). As illustrated in FIG. 1, column signal processing circuits 37 are disposed in correspondence with respective columns of the unit pixel cells 10 in the pixel array PA. The column signal processing circuits 37 are connected with a horizontal signal readout circuit (also referred to as "column scanning circuit") 38. The horizontal signal readout circuit 38 sequentially reads out signals from the column signal processing circuits 37 to a horizontal common signal line 49.

In the configuration illustrated in FIG. 1, the unit pixel cell 10 has a reset transistor 28. Like the signal detection transistor 24 and the address transistor 26, the reset transistor 28 is, for example, an electric field transistor. Unless specifically stated otherwise, the following description will be directed to a case where an N-channel MOS is used as the reset transistor 28. As illustrated in FIG. 1, the reset transistor 28 is connected between a reset voltage line 44 that supplies a reset voltage Vr, and the charge storage node 41. The control terminal (the gate in this case) of the reset transistor 28 is connected to a reset control line 48. Controlling the potential of the reset control line 48 allows the potential of the charge storage node 41 to be reset to the reset voltage Vr. In this example, the reset control line 48 is connected to the vertical scanning circuit 36. Thus, as the vertical scanning circuit 36 applies a predetermined voltage to each reset control line 48, a plurality of unit pixel cells 10 arranged in each row can be reset on a row-by-row basis.

In this example, the reset voltage line 44, which supplies the reset voltage Vr to the reset transistor 28, is connected to a reset voltage supply circuit 34 (to be referred to as "reset voltage source 34" hereinafter). The reset voltage source 34 may be of any configuration that allows the reset voltage source 34 to supply a predetermined reset voltage Vr to the reset voltage line 44 during operation of the image sensor 100. Thus, like the voltage supply circuit 32 mentioned above, the reset voltage source 34 is not limited to a specific power circuit. The voltage supply circuit 32 and the reset voltage source 34 may be parts of a single voltage supply circuit, or may be independent discrete voltage supply circuits. Either one or both of the voltage supply circuit 32 and the reset voltage source 34 may be a part of the vertical scanning circuit 36. Alternatively, the sensitivity control voltage from the voltage supply circuit 32 and/or the reset voltage Vr from the reset voltage source 34 may be supplied to each unit pixel cell 10 via the vertical scanning circuit 36.

It is also possible to use the power supply voltage VDD of the signal detection circuit 14 as the reset voltage Vr. In this case, a voltage supply circuit (not illustrated in FIG. 1) that supplies a power supply voltage to each unit pixel cell 10, and the reset voltage source 34 can be configured as a common component. Further, the power line 40 and the reset voltage line 44 can be configured as a common line, thus simplifying wiring in the pixel array PA. It is to be noted, however, that using different voltages as the reset voltage Vr and the power supply voltage VDD of the signal detection circuit 14 allows for more flexible control of the image sensor 100.

Figure 2:
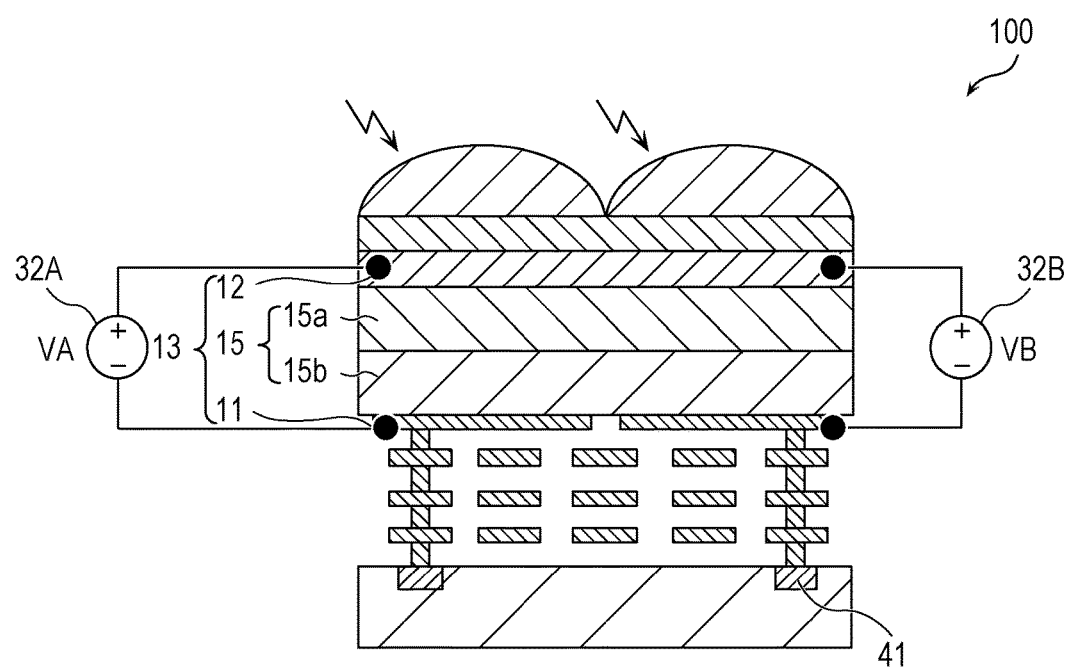
FIG. 2 is a schematic cross-sectional view of an image sensor according to an embodiment, illustrating an exemplary device structure of the image sensor.

FIG. 2 is a schematic representation of an exemplary configuration of two adjacent unit pixel cells 10 included in the image sensor 100 according to an embodiment. The image sensor 100 illustrated in FIG. 2 has the photoelectric converter 13, voltage supply circuits 32A and 32B connected to the photoelectric converter 13, a charge storage region 41, and the signal detection circuit 14 (not illustrated in FIG. 2). The photoelectric converter 13 has a pixel electrode 11, a counter electrode 12, and a photoelectric conversion layer 15 sandwiched between the pixel electrode 11 and the counter electrode 12. The photoelectric conversion layer 15 includes at least two photoelectric conversion films 15a and 15b. The photoelectric conversion film 15a and 15b are made of materials having different spectral sensitivity characteristics. The photoelectric converter 13 may further include a doping layer between the photoelectric conversion layer 15 and the pixel electrode 11, or a charge blocking layer between the photoelectric conversion layer 15 and the counter electrode 12.

FIG. 2 schematically illustrates the arrangement of various portions constituting the image sensor 100, and the dimensions of various portions illustrated in FIG. 2 do not necessarily accurately reflect the corresponding dimensions in the actual device. The same applies to the other drawings of the present disclosure.

The counter electrode 12 is made of a transparent conductive material, for example, ITO. The counter electrode 12 may be common to all pixels, or may be separated for each row.

The pixel electrode 11 is made of a conductive material that is highly opaque and can exist stably, for example, TiN or TaN. Further, the pixel electrode 11 is separated for each pixel.

The term "transparent" as used in the embodiments means transmitting at least a portion of light in the wavelength range to be detected, and does not necessarily mean transmitting light over the entire wavelength range of visible light. Light detected by a photosensor according to the embodiments is not limited to light within the wavelength range of visible light (e.g., from 380 nm or more to 780 nm or less). In the embodiments, the entire spectrum of electromagnetic radiation including infrared and ultraviolet radiation will be expressed as "light" for the convenience of discussion.

A semiconductor material is typically used as the material of the photoelectric conversion layer 15. The photoelectric conversion layer 15 generates an electron-hole pair (exciton) inside the photoelectric conversion layer 15 when irradiated by light. The generated exciton is dissociated into an electron and a hole by an electric field applied to the photoelectric conversion layer 15. The electron and hole are each drifted toward the corresponding electrode in accordance with the electric field. Although the following description will be directed to a case where an organic semiconductor material is used as a material forming the photoelectric conversion layer 15, a compound semiconductor material typically represented by, for example, hydrogenated amorphous silicon or CdSe, or a metal oxide semiconductor material such as ZnO may be used. If an organic semiconductor material is used, the photoelectric conversion layer 15 may be either a staked film (heterojunction) or mixed film (bulk heterojunction) of donor and acceptor materials. Either one or both of the donor and acceptor materials may absorb light.

The charge blocking layer has a function such that, out of charges generated in the photoelectric conversion layer 15 by application of voltage, the charge blocking layer permits transport of a charge of one polarity toward the counter electrode 12 while blocking transport of a charge of the opposite polarity. Therefore, the material of the charge blocking layer is not necessarily an insulating material. This selective charge transport depends on the magnitude of the energy barrier at the interface with an adjacent semiconductor material or electrode material present in the path of charge transport.

For example, for charge transport from an organic photoelectric conversion layer with a lowest-unoccupied-molecular-orbital (LUMO) energy level of 4.0 eV to an electrode material with a Fermi level of 5.1 eV, the charge blocking layer has the function of transporting electrons and blocking holes. At this time, as the LUMO energy level of the charge blocking layer becomes equal to or deeper than 4.0 eV, the magnitude of the energy barrier decreases, resulting in improved electron transport efficiency. Further, as the HOMO energy level of the charge blocking layer becomes deeper than 5.1 eV, the magnitude of the energy barrier increases, resulting in improved hole blocking.

For example, fullerene has a LUMO energy level of 4.0 eV and a HOMO energy level of 6.4 eV, and thus can be used as the material of the charge blocking layer. The HOMO energy level of an organic material can be determined by, for example, photoelectron spectroscopy, photoelectron yield spectroscopy, or other methods. The LUMO energy level can be determined by inverse photoelectron spectroscopy, or by subtracting the energy at the end of the absorption spectrum from the HOMO energy level.

The voltage supply circuits 32A and 32B are each capable of supplying a predetermined voltage to the counter electrode 12. The voltage supply circuits 32A and 32B may supply a fixed voltage at all times during operation of the image sensor 100. The voltage supply circuits 32A and 32B may be variable-voltage supply sources such that the voltage supply circuits 32A and 32B supply a first voltage to the counter electrode 12 in the exposure period, and supply a second voltage different from the first voltage to the counter electrode 12 in the readout period. Each of the voltage supply circuits 32A and 32B is not limited to a specific power circuit but may be a circuit that generates a predetermined voltage or may be a circuit that converts a voltage supplied from another power source into a predetermined voltage. The first voltage and/or the second voltage may be applied in the form of a pulse, or may be repeatedly applied periodically or quasi-periodically.

The charge storage region 41 stores a signal charge obtained by photoelectric conversion, and converts the signal charge into voltage. As the charge storage region 41, for example, a junction capacitance (FD) formed on a substrate, or a metal-insulator-metal (MIM) with an insulating material such as $SiO_2$, $Al_2O_3$, SiN, $HfO_2$, or $ZrO_2$ used for its insulating layer may be used. Further, the FD may be a composite capacitance formed by a parallel or serial connection of a plurality of capacitive elements and parasitic capacitances.

The signal detection circuit 14 is implemented by a configuration including a source-follower transistor that reads out the voltage obtained by photoelectric conversion in the charge storage region 41. In this case, the charge storage region 41 and the source-follower transistor are electrically connected to the counter electrode 12 of the photoelectric converter 13. Since the storage capacitance is connected to the gate-side of the source-follower transistor, signal charge can be read out non-destructively.

As described above, excitons generated by photoelectric conversion of light incident on the photoelectric conversion layer 15 are subjected to efficient charge separation by the electric field applied to the photoelectric conversion layer 15, causing the excitons to be dissociated into electrons and holes. These electrons and holes move in the film in accordance with the electric field and are extracted toward the corresponding electrodes. Generally, many photoelectric conversion materials require a certain magnitude of electric field for charge separation and charge movement in the film. With this electric field defined as threshold electric field $E_{TH}$, a current I through the photoelectric converter 13 can be written as Eq. 1 below by using a photocurrent $I_{PH}$ caused by the charge obtained by photoelectric conversion.

$$I = I_{PH} I_{DARK} (E > E_{TH})$$

$$I = I_{DARK} (E \leq E_{TH}) \quad (1)$$

In the above equation, $I_{DARK}$ denotes a current that flows even in a dark state, which is caused by charges such as the charge generated in a photoelectric conversion material due to thermal excitation or other processes, and the charge injected from the electrode. The current $I_{DARK}$, which increases with increasing electric field applied to the photoelectric converter 13, is sufficiently small compared to the photocurrent $I_{PH}$. Thus, for the convenience of explanation, $I_{DARK}$ is assumed to have substantially the same value irrespective of the applied electric field.

A description is now given of a case where the photoelectric converter 13 is of a stacked structure having the photoelectric conversion film 15a including a first photoelectric conversion material having sensitivity in a first wavelength region, and the photoelectric conversion film 15b including a second photoelectric conversion material having sensitivity in a second wavelength region. In this case, letting D1 denote the film thickness of the photoelectric conversion film 15a, Z1 denote the impedance of the photoelectric conversion film 15a, D2 denote the film thickness of the photoelectric conversion film 15b, Z2 denote the impedance of the photoelectric conversion film 15b, and V denote the voltage applied to the photoelectric converter 13, then the electric fields E1 and E2 applied to the respective film layers are represented by Eq. 2 below.

$$E1 = \frac{Z1}{Z1+Z2}\frac{V}{D1} \qquad (2)$$
$$E2 = \frac{Z2}{Z1+Z2}\frac{V}{D2}$$

When the film thickness D1 and the film thickness D2 are substantially the same, if, for example, Z1 is much greater than Z2, then from Eq. 2, the electric field E1 exerted on the photoelectric conversion film 15a has a relatively small value, and can fall below the threshold electric field represented by Eq. 1 when a low voltage is applied. Accordingly, for the image sensor 100 having a stacked structure of the photoelectric conversion film 15a and the photoelectric conversion film 15b, under application of a low voltage, only the charge obtained by photoelectric conversion in the photoelectric conversion film 15a can be detected, whereas under application of a high voltage, the charges obtained by photoelectric conversion in both the photoelectric conversion film 15a and the photoelectric conversion film 15b can be detected in a superimposed state. The high voltage mentioned above means a high voltage relative to the low voltage mentioned above, and may be less than 10 V.

For example, a combination of photoelectric conversion materials that provides a large difference in impedance may be achieved by using, as the photoelectric conversion film 15a, a photoelectric conversion film with a film thickness of 60 nm obtained by co-depositing SnNc and $C_{70}$ at a ratio of 1:1, and using, as the photoelectric conversion film 15b, a photoelectric conversion film with a film thickness of 60 nm obtained by co-depositing DTDCTB and $C_{70}$ at a ratio of 1:1. In this case, under the condition of a bias voltage of −8 V and a frequency of 1 Hz, the impedance of the photoelectric conversion film 15a is $4.2 \times 10^3 \Omega$, and the impedance of the photoelectric conversion film 15b is $7.5 \times 10^6 \Omega$.

This configuration makes it possible to control the spectral sensitivity of SnNc, which is a photoelectric conversion material included in the photoelectric conversion film 15a, by means of the voltage applied to the photoelectric converter 13. The image sensor 100 according to an embodiment has the photoelectric converter 13 configured as described above, and in a given exposure period, a voltage VA is applied to some of a plurality of pixel regions, and a voltage VB higher than the voltage VA is applied to the remainder of the pixel regions. For example, different voltages can be applied to two pixel regions by the voltage supply circuits 32A and 32B illustrated in FIG. 2. At this time, the following condition holds for the voltage VA.

$$E1 = \frac{Z1}{Z1+Z2}\frac{VA}{D1} \leq E_{TH1} \qquad (3)$$

That is, the voltage VA desirably has the greatest possible value that does not allow the charge obtained by photoelectric conversion in the photoelectric conversion film 15a to be extracted out of the photoelectric conversion film 15a. This configuration ensures that for the pixel region to which the voltage VA is applied, the charge obtained by photoelectric conversion in the photoelectric conversion film 15b is output as a signal, and for the pixel region to which the voltage VB is applied, both the charge obtained by photoelectric conversion in the photoelectric conversion film 15a and the charge obtained by the photoelectric conversion film 15b are output as a signal. These signals represent information obtained by exposure at exactly the same timing and in exactly the same period, and thus have simultaneity.

Accordingly, a signal based on the charge obtained by photoelectric conversion in the photoelectric conversion film 15a can be extracted by subtracting a signal based on the charge obtained by photoelectric conversion in the photoelectric conversion film 15b from a signal based on the charge obtained by photoelectric conversion in the photoelectric conversion film 15a and the charge obtained by photoelectric conversion in the photoelectric conversion film 15b. In this case, pixels to which to apply different voltages are desirably pixels that are adjacent to each other. In an alternative configuration, a pixel region corresponding to one microlens is split in two, and the resulting two sub-pixels serve as the above-mentioned pixels to which different voltages are applied. In another alternative configuration, a signal based on the charge obtained by photoelectric conversion in the photoelectric conversion film 15a and the charge obtained by photoelectric conversion in the photoelectric conversion film 15b, and a signal based on the charge obtained by photoelectric conversion in the photoelectric conversion film 15b are each multiplied by a gain before the above-mentioned subtraction is performed. In this case, although the above-mentioned gain applied to each of the two signals may not necessarily be the same, it is assumed that each of the signals is to be multiplied by a gain determined in advance for each pixel.

Applying different voltages in the same exposure period to the photoelectric converter 13 for different pixel regions can be easily achieved by, for example, separating the counter electrode 12 for each row. In this case, patterning of the counter electrode 12, which is made of is a conductive material, can be achieved by, for example, photolithography. Each separated portion of the counter electrode 12 may be connected with a different voltage supply source so that different voltages are applied to odd and even rows.

In an alternative configuration, the counter electrode 12 is not patterned and the same voltage is applied to all pixels, and the voltage applied to the pixel electrode 11 is varied for each pixel. For example, in resetting the potential of the charge storage region 41 to a reference voltage, two reference voltages may be used so that a different reference voltage is set for each pixel.

Imaging Device

Figure 3:
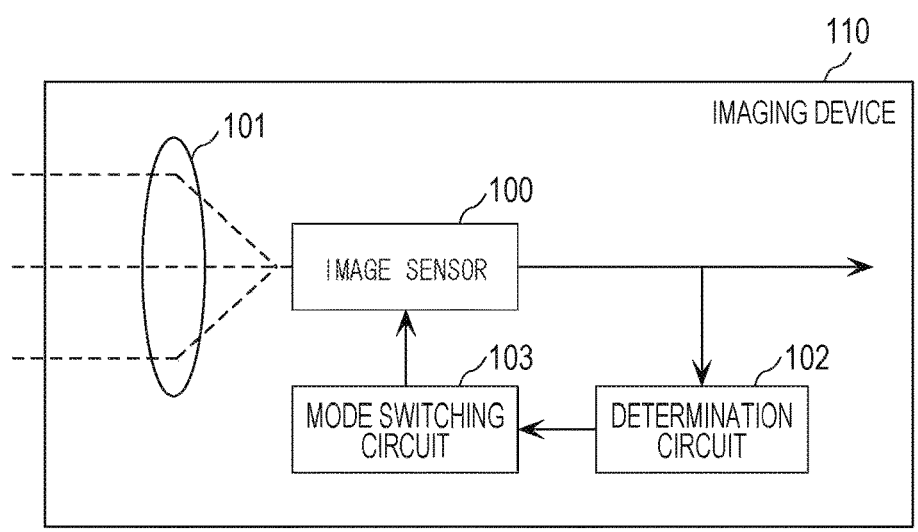
FIG. 3 is a block diagram illustrating a configuration of an imaging device according to an embodiment.

Next, an imaging device 110 according to an embodiment including the image sensor 100 will be described. FIG. 3 illustrates a configuration of the imaging device 110. As illustrated in FIG. 3, the imaging device 110 includes the image sensor 100, an optical system 101 including a condenser lens or other components, a determination circuit 102, and a mode switching circuit 103.

As described above, the image sensor 100 allows its operation mode to be electrically switched between a first mode that performs imaging in a first imaging wavelength band and a second mode that performs imaging in a second imaging wavelength band different from the first imaging wavelength band. The first imaging wavelength band may represent the visible-light region, and the second imaging wavelength band may represent the visible-light region and the near-infrared region. In the following example, the first mode will be referred to as "RGB mode", and the second mode will be referred to as "RGB+IR mode".

Specifically, the image sensor 100 includes the photoelectric converter 13, and the voltage supply circuit 32 (the voltage supply circuits 32A and 32B). The photoelectric converter 13 includes the pixel electrode 11 and the counter electrode 12 that are opposed to each other, and the photoelectric conversion layer 15 sandwiched between the pixel electrode 11 and the counter electrode 12.

The voltage supply circuit 32 selectively applies, between the pixel electrode 11 and the counter electrode 12, a first voltage or a second voltage different from the first voltage.

When the voltage supply circuit 32 applies the first voltage between the pixel electrode 11 and the counter electrode 12, the operation mode is switched to the first mode (RGB mode), and when the voltage supply circuit 32 applies the second voltage between the pixel electrode 11 and the counter electrode 12, the operation mode is switched to the second mode (RGB+IR mode).

The determination circuit 102 determines whether ambient light includes near-infrared light based on information obtained in the first mode (RGB mode) and information obtained in the second mode (RGB+IR mode).

The mode switching circuit 103 switches the operation mode to the first mode (RGB mode) if the operation mode is the second mode and it is determined by the determination circuit 102 that ambient light includes near-infrared light. The mode switching circuit 103 also switches the operation mode to the second mode (RGB+IR mode) if the operation mode is the first mode and it is determined by the determination circuit 102 that ambient light does not include near-infrared light.

Figure 4:
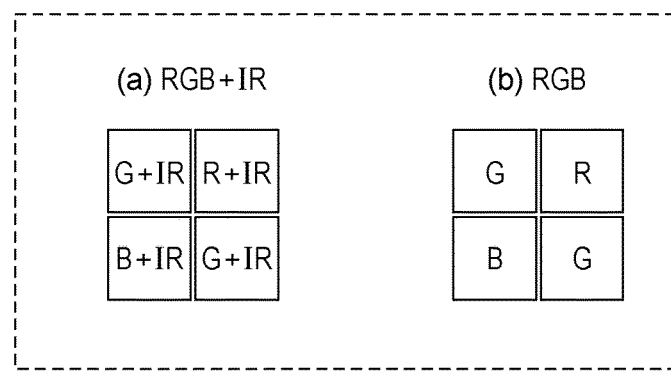
FIG. 4 schematically illustrates a pixel configuration according to an embodiment, and a signal obtained in the corresponding mode.

FIG. 4 schematically illustrates a pixel configuration according to an embodiment, and a signal obtained in the corresponding mode. As illustrated in (a) and (b) in FIG. 4, each pixel has, for example, a so-called Bayer pattern including one R pixel, two G pixels, and one B pixel. In the RGB+IR mode, a signal corresponding to red and infrared (R+IR) is obtained at the R pixel, a signal corresponding to green and infrared (G+IR) is obtained at the G pixel, and a signal corresponding to blue and infrared (B+IR) is obtained at the B pixel. In the RGB mode, a signal corresponding to red (R) is obtained at the R pixel, a signal corresponding to green (G) is obtained at the G pixel, and a signal corresponding to blue (B) is obtained at the B pixel.

Figure 5:
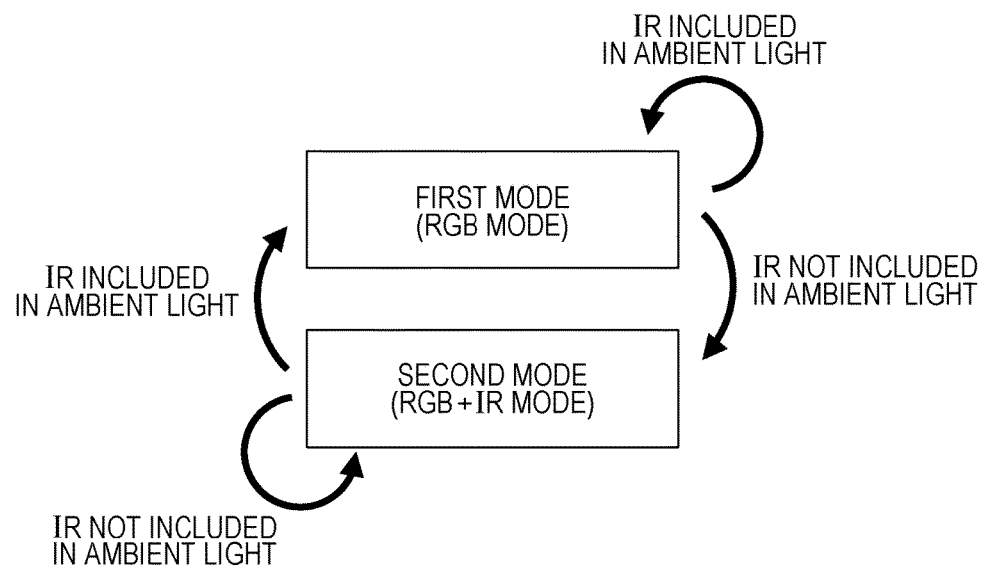
FIG. 5 illustrates an exemplary algorithm of an imaging technique according to an embodiment.

FIG. 5 is a sequence diagram illustrating operation of the imaging device 110.

As illustrated in FIG. 5, when the operation mode is the first mode (RGB mode), the imaging device 110 determines whether ambient light includes near-infrared light based on information obtained in the first mode (RGB mode) and information obtained in the second mode (RGB+IR mode). Then, the imaging device 110 maintains the first mode (RGB mode) if the ambient light includes near-infrared light, and switches the operation mode to the second mode (RGB+IR mode) if the ambient light does not include near-infrared light.

When the operation mode is the second mode (RGB+IR mode), the imaging device 110 determines whether ambient light includes near-infrared light based on information obtained in the first mode (RGB mode) and information obtained in the second mode (RGB+IR mode). The imaging device 110 switches the operation mode to the first mode (RGB mode) if the ambient light includes near-infrared light, and maintains the second mode if the ambient light does not include near-infrared light.

Figure 6:
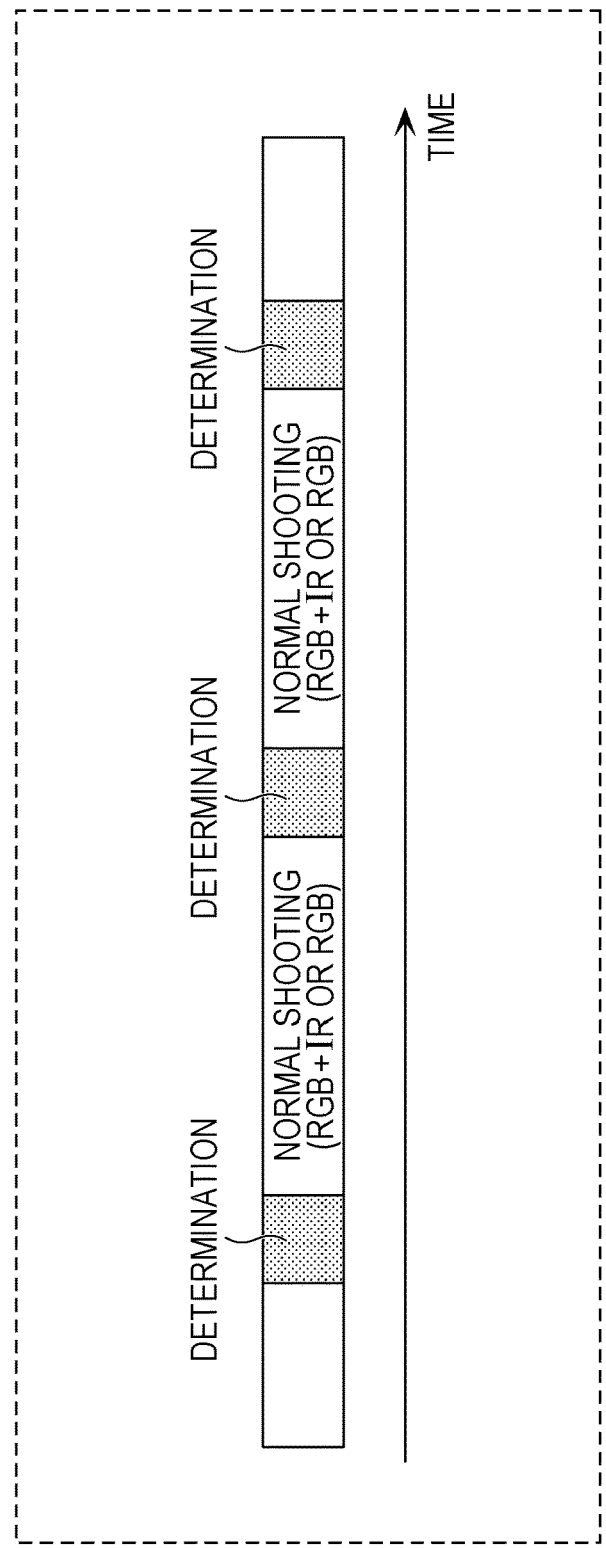
FIG. 6 illustrates an exemplary operation of an imaging device according to an embodiment.

FIG. 6 illustrates a procedure of operation of the imaging device 110. As illustrated in FIG. 6, to select either the RGB mode or the RGB+IR mode, a determination of whether ambient light includes near-infrared light is performed periodically. Then, the imaging device 110 performs a normal shooting operation in the RGB mode or the RGB+IR mode according to the result of this determination. In this way, a determination of whether ambient light includes near-infrared light is performed once every plurality of frames.

The above-mentioned determination may be performed with any frequency. Further, the above-mentioned determination may be made based on a change in the mean illuminance or contrast of a captured image. This is because a decrease in mean illuminance or contrast when operating in the RGB mode is indicative of deteriorated visibility. For example, the imaging device 110 may be provided with a contrast detector (not illustrated) that detects the contrast of a captured image based on the output of the photoelectric converter 13, and the above-mentioned determination may be made based on the contrast detected by the contrast detector. If mode switching affects focus due to reasons such as a difference in focus position or aberration between imaging modes, focus correction may be performed when switching between modes.

The frequency with which the determination is performed may be specified not by the number of frames but by time. Further, the determination may be performed not periodically but when some trigger occurs.

Figure 7:
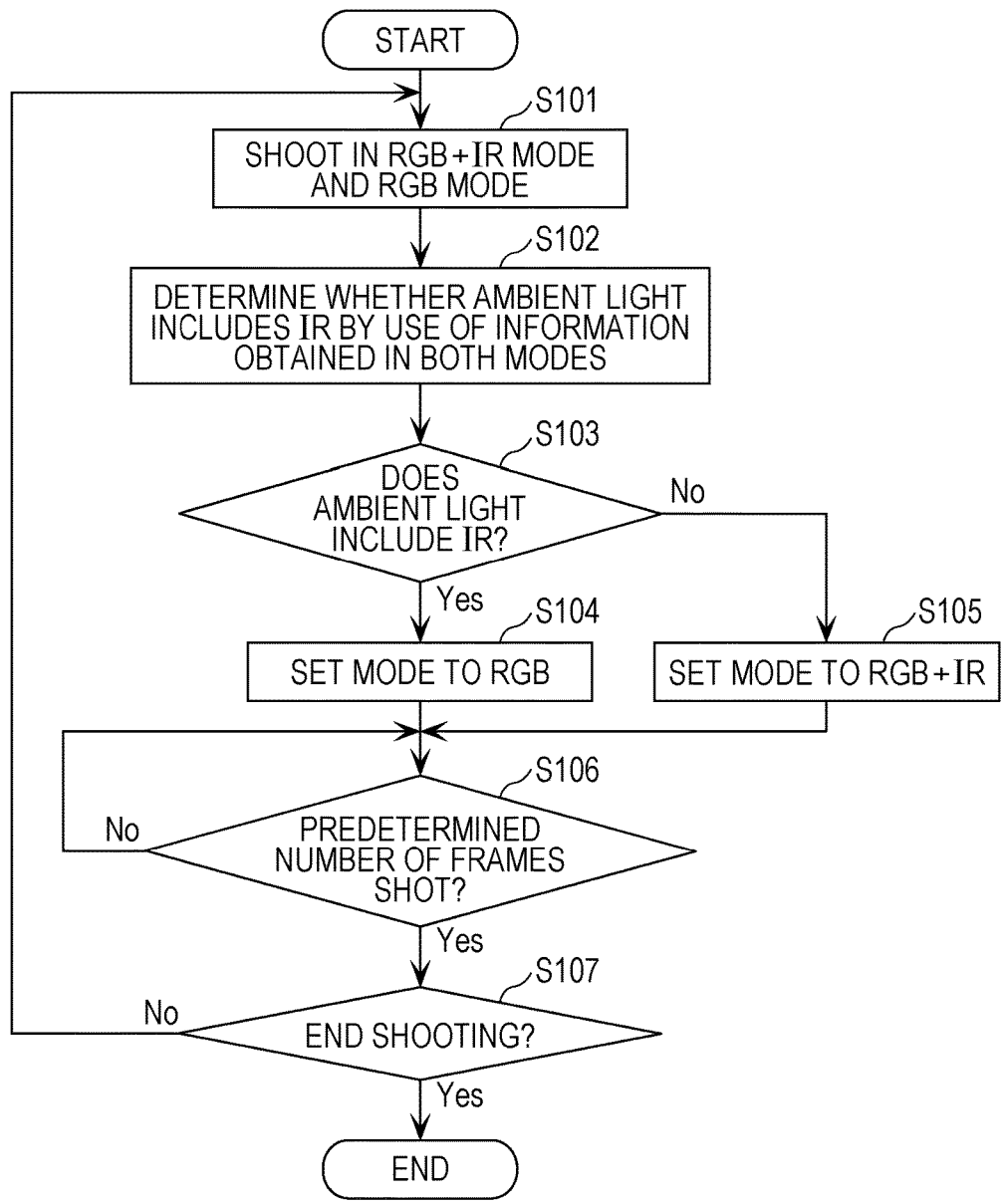
FIG. 7 is a flowchart of an exemplary operation of an imaging device according to an embodiment.
Figure 8:
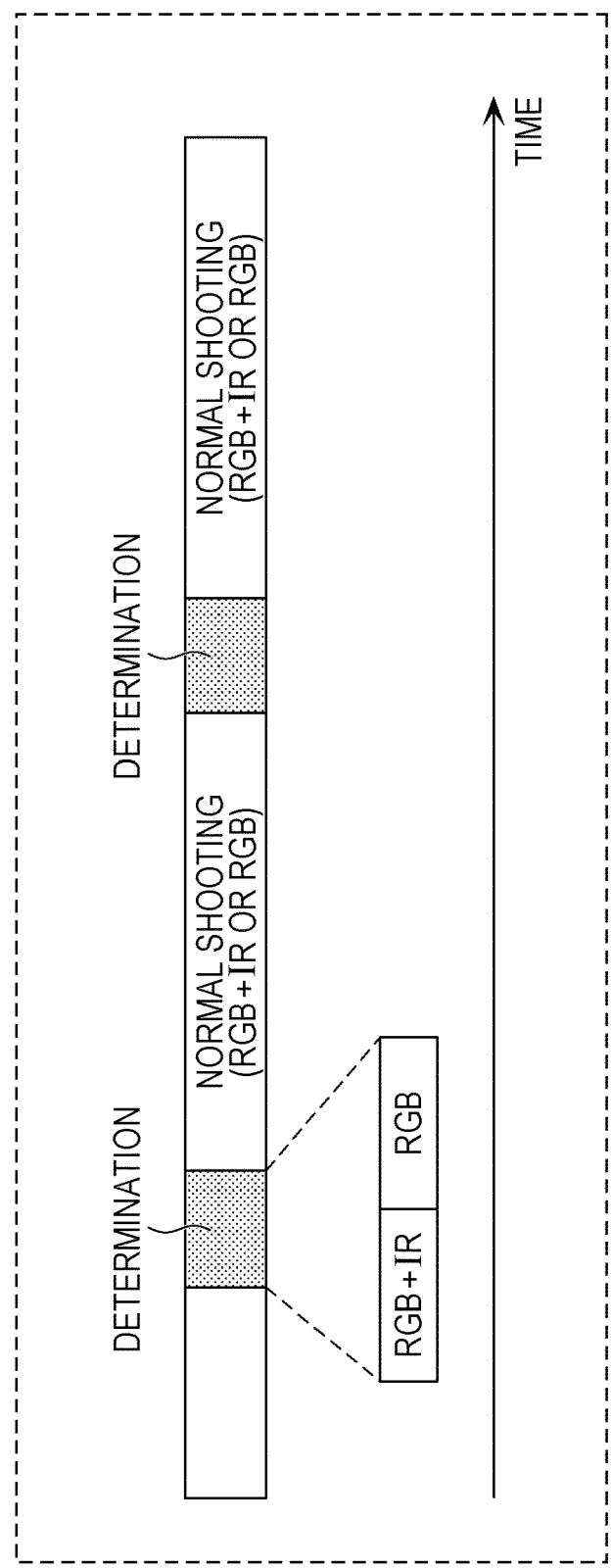
FIG. 8 illustrates an exemplary operation of an imaging device according to an embodiment.

FIG. 7 is a flowchart illustrating exemplary operation of the imaging device 110. As illustrated in FIG. 7, first, the imaging device 110 performs shooting in the RGB+IR mode and in the RGB mode (S101). These shooting operations in two modes may be either performed simultaneously in a single frame by applying a different voltage for each pixel as described above, or performed successively in time series as illustrated in FIG. 8. Although in FIG. 8 shooting in the RGB mode is performed after shooting in the RGB+IR mode, the order of the two shooting operations may be reversed.

Next, the determination circuit 102 determines whether ambient light includes near-infrared light by use of an image shot in the RGB+IR mode and an image shot in the RGB mode (S102). When it is herein stated that ambient light includes near-infrared light, this means that the amount of near-infrared light present is greater than a predetermined threshold, and when it is herein stated that ambient light does not include near-infrared light, this means that the amount of near-infrared light present is less than the predetermined threshold. Details of this determination process will be described later.

If ambient light includes near-infrared light (Yes at S103), the mode switching circuit 103 sets the operation mode to the RGB mode (S104). If ambient light does not include near-infrared light (No at S103), the mode switching circuit 103 sets the operation mode to the RGB+IR mode (S105).

Then, a predetermined number of frames are shot in the operation mode thus set (S106) with the imaging device 110. Thereafter, if it is determined not to end shooting (No at S107), then the procedure from step S101 onwards is performed again. If it is determined to end shooting (Yes at S107), the imaging device 110 ends the procedure.

Shooting is ended based on, for example, an instruction provided from the outside of the imaging device 110. The determination of whether to end shooting (S107) may be performed at any timing, and may not necessarily be performed at the timing illustrated in FIG. 7.

The determination of whether ambient light includes near-infrared light (S102) will be described in detail below. The determination circuit 102 performs the above determination by comparing, with a predetermined threshold, the ratio between a signal obtained in the RGB mode and a signal obtained in the RGB+IR mode. Specifically, the determination circuit 102 performs the above determination by comparing, with a predetermined threshold, the ratio between the arithmetic mean of a plurality of pixel values included in an image obtained in the RGB mode, and the arithmetic mean of a plurality of pixel values included in an image obtained in the RGB+IR mode. That is, the determination circuit 102 calculates α represented by Eq. 4 below.

$$\alpha = \text{Ave(RGB+IR)}/\text{Ave(RGB)} \quad (4)$$

In the above equation, Ave(RGB+IR) represents the arithmetic mean of the pixel values of all pixels included in the image obtained in the RGB+IR mode, and Ave(RGB) represents the arithmetic mean of the pixel values of all pixels included in the image obtained in the RGB mode.

Next, the determination circuit 102 compares the calculated value of α and a predetermined threshold β with each other, and if α is greater than β, the determination circuit 102 determines that ambient light includes infrared light. The RGB mode is thus selected. If α is less than β, the determination circuit 102 determines that ambient light does not include infrared light. The RGB+IR mode is thus selected.

Although the arithmetic mean of the pixel values of all pixels is used in the above example, other values such as the sum or median of the pixel values of all pixels may be used. Further, the calculation may be performed not for all pixels but for some pixels.

The threshold β is specified by the ratio between the sensitivity in the RGB mode and the sensitivity in the RGB+IR mode, as represented by Eq. 5 below.

$$\beta = \eta(\text{RGB+IR})/\eta(\text{RGB}) \quad (5)$$

Figures 9, 10:
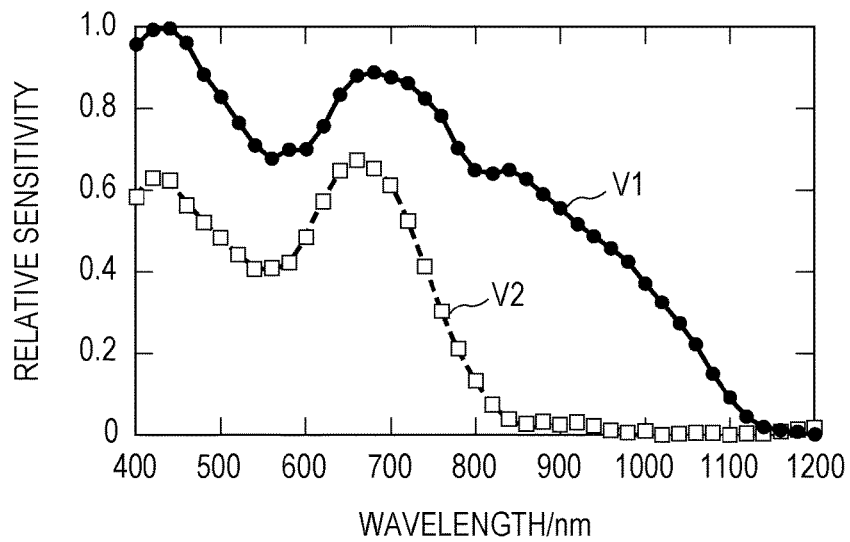
FIG. 9 is a graph illustrating the sensitivity characteristics of each mode according to an embodiment.
FIG. 10 illustrates determination results and the resulting selected operation modes according to an embodiment.

FIG. 9 is a graph illustrating the sensitivity characteristics of each mode according to an embodiment. As illustrated in FIG. 9, η(RGB+IR) denotes the sensitivity to visible light in the RGB+IR mode (under application of a voltage V1), and η(RGB) denotes the sensitivity to visible light in the RGB mode (under application of a voltage V2).

The above-mentioned calculation may be performed each of the R, G, and B colors. That is, αR, αG, and αB respectively corresponding to R, G, and B are represented by Eqs. 6 to 8 below.

$$\alpha R = \text{Ave}R(\text{RGB+IR})/\text{Ave}R(\text{RGB}) \quad (6)$$

$$\alpha G = \text{Ave}G(\text{RGB+IR})/\text{Ave}G(\text{RGB}) \quad (7)$$

$$\alpha B = \text{Ave}B(\text{RGB+IR})/\text{Ave}B(\text{RGB}) \quad (8)$$

AveR(RGB+IR) denotes the arithmetic mean of the pixel values of R pixels included in an image obtained in the RGB+IR mode. AveG(RGB+IR) denotes the arithmetic mean of the pixel values of G pixels included in the image obtained in the RGB+IR mode. AveB(RGB+IR) denotes the arithmetic mean of the pixel values of B pixels included in the image obtained in the RGB+IR mode. AveR(RGB) denotes the arithmetic mean of the pixel values of R pixels included in an image obtained in the RGB mode. AveG(RGB) denotes the arithmetic mean of the pixel values of G pixels included in the image obtained in the RGB mode. AveB(RGB) denotes the arithmetic mean of the pixel values of B pixels included in the image obtained in the RGB mode.

That is, βR, βG, and βB respectively corresponding to R, G, and B are represented by Eqs. 9 to 11 below.

$$\beta R = \eta R(\text{RGB+IR})/\eta R(\text{RGB}) \quad (9)$$

$$\beta G = \eta G(\text{RGB+IR})/\eta G(\text{RGB}) \quad (10)$$

$$\beta B = \eta B(\text{RGB+IR})/\eta B(\text{RGB}) \quad (11)$$

ηR(RGB+IR) denotes the sensitivity to red light in the RGB+IR mode. ηG(RGB+IR) denotes the sensitivity to green light in the RGB+IR mode. ηB(RGB+IR) denotes the sensitivity to blue light in the RGB+IR mode. ηR(RGB) denotes the sensitivity to red light in the RGB mode. ηG(RGB) denotes the sensitivity to green light in the RGB mode. ηB(RGB) denotes the sensitivity to blue light in the RGB mode.

The determination circuit 102 compares αR with βR, compares αG with βG, and compares αB with βB. The determination circuit 102 determines whether ambient light includes infrared light based on the results of these comparisons. In one example, the determination circuit 102 determines that ambient light includes infrared light if all of the following three conditions are met: αR>βR, αG>βG, and αB>βB, and otherwise determines that ambient light does not include infrared light. In another example, the determination circuit 102 determines that ambient light includes infrared light if at least one of the three conditions mentioned above is met, and otherwise determines that ambient light does not include infrared light. In another example, the determination circuit 102 determines that ambient light includes infrared light if at least two of the three conditions mentioned above are met, and otherwise determines that ambient light does not include infrared light.

The above determination may be performed only for one or two of the R, G, and B colors.

The determination circuit 102 is able to determine whether ambient light includes near-infrared light through the determination mentioned above. It can be also said that this determination is a determination of whether imaging is performed under sunlight.

FIG. 10 illustrates the relationship between the result of above determination and operation mode. As illustrated in FIG. 10, if ambient light includes infrared light, that is, when under sunlight irradiation, the imaging device 110 selects the RGB mode as the operation mode. If ambient light includes infrared light, the infrared light is mixed in the obtained image signal, resulting in an image that appears more whitish than when perceived with the human eyes. This leads to degradation of color reproduction. Selecting the RGB mode as the operation mode when under sunlight irradiation as in the embodiments makes it possible to mitigate such degradation of color reproduction.

If the condition α<β is met, the determination circuit 102 determines that ambient light is equal to or below the noise level, and the illuminance is insufficient. Thus, the imaging device 110 selects the RGB+IR mode, and causes a light source that radiates infrared light to turn on. This allows the imaging device 110 to shoot a subject in dark places by use of infrared light. A light source that radiates infrared light may not be turned on in the RGB+IR mode.

Under artificially illuminated conditions such as indoors, ambient light does not include infrared light in some cases. In such cases, degradation of color reproduction occurs in neither the RGB+IR mode nor the RGB mode, and thus whichever mode may be selected. It is to be noted, however, that as illustrated in FIG. 9, the sensitivity of the RGB+IR mode is higher than the sensitivity of the RGB mode. Accordingly, by selecting the RGB+IR mode even in conditions where ambient light does not include infrared light such as indoors as in the embodiments, an image with high sensitivity can be obtained.

Although the foregoing description is directed to a case where the ratio between a signal obtained in the RGB mode and a signal obtained in the RGB+IR mode is compared with a threshold to perform the determination, the determination may be performed based on the difference between a signal obtained in the RGB mode and a signal obtained in the RGB+IR mode.

For example, the determination circuit 102 may calculate $\gamma$ represented by Eq. 12 below, and may determine that ambient light includes infrared light if $\gamma$ is greater than a predetermined threshold, and may determine that ambient light does not include infrared light if $\gamma$ is less than the threshold. The value of $\beta$ in Eq. 12 below is represented by, for example, Eq. 5.

$$\gamma = \mathrm{Ave}(\mathrm{RGB+IR}) - \beta \times \mathrm{Ave}(\mathrm{RGB}) \tag{12}$$

Although the signal obtained in the RGB mode is multiplied by $\beta$ in Eq. 12, it suffices if the ratio between the signal obtained in the RGB+IR mode and the signal obtained in the RGB mode can be changed. That is, the signal obtained in the RGB+IR mode may be multiplied by the inverse of $\beta$. Alternatively, the signal obtained in the RGB+IR mode and the signal obtained in the RGB mode may be multiplied by different gains.

In this case as well, the above-mentioned calculation may be performed for each of the R, G, and B colors.

Although the imaging device according to the embodiments has been described above, the present disclosure is not limited to the embodiments.

Individual processing units included in the imaging device according to the above embodiments are each typically implemented as an LSI, which is an integrated circuit. These processing units may be each individually formed as a single chip, or may be integrated into a single chip to include some or all thereof.

Further, circuit integration may not necessarily be implemented by LSI but may be implemented by use of dedicated circuitry or a general-purpose processor. A field programmable gate array (FPGA), which is programmable after fabrication of the LSI, or a reconfigurable processor, which allows reconfiguration of the connections and settings of circuit cells inside the LSI, may be used.

Although an imaging device according to one or more aspects of the present disclosure have been described above with reference to the embodiments, the present disclosure is not limited to the embodiments. Various modifications to the embodiments that may be conceived by those skilled in the art, as well as combinations of constituent elements in different embodiments may fall within the scope of one or more aspects of the present disclosure, as long as such modifications and combinations do not depart from the spirit of the present disclosure.

INDUSTRIAL APPLICABILITY

The imaging device according to an embodiment of the present disclosure is applicable to image sensor apparatuses, and is particularly useful for shooting of a subject that moves at high speed. For example, the imaging device according to an embodiment of the present disclosure finds utility in applications such as a machine vision camera used to perform processing such as determining the state of products, detecting defects in products, and sorting products in a production plant, or a vehicle-mounted camera serving as an input device for a controller to ensure safe driving of a vehicle.

What is claimed is:

1. A method for controlling an imaging device that allows switching of an operation mode between a first mode to perform imaging in a first imaging wavelength band and a second mode to perform imaging in a second imaging wavelength band different from the first imaging wavelength band, the method comprising:
   when the operation mode is the first mode,
      determining whether ambient light includes near-infrared light based on information obtained in the first mode and information obtained in the second mode,
      maintaining the first mode when the ambient light includes near-infrared light, and
      switching the operation mode to the second mode when the ambient light does not include near-infrared light; and
   when the operation mode is the second mode,
      determining whether ambient light includes near-infrared light based on information obtained in the first mode and information obtained in the second mode,
      switching the operation mode to the first mode when the ambient light includes near-infrared light, and
      maintaining the second mode when the ambient light does not include near-infrared light.

2. The method for controlling an imaging device according to claim 1,
   wherein the first imaging wavelength band comprises a visible-light region, and the second imaging wavelength band comprises a visible-light region and a near-infrared region.

3. The method for controlling an imaging device according to claim 1, wherein
   the switching the operation mode to the first mode is performed by applying a first voltage between a pixel electrode and a counter electrode of the imaging device, and
   the switching the operation mode to the second mode is performed by applying a second voltage, different from the first voltage, between the pixel electrode and the counter electrode of the imaging device.

4. The method for controlling an imaging device according to claim 1,
   wherein the determining of whether ambient light includes near-infrared light comprises determining whether imaging is performed under sunlight.

5. The method for controlling an imaging device according to claim 1,
   wherein the determining of whether ambient light includes near-infrared light is performed once every plurality of frames.

6. The method for controlling an imaging device according to claim 1,
wherein the determining of whether ambient light includes near-infrared light is made by comparing, with a predetermined threshold, a ratio between a signal obtained in the first mode and a signal obtained in the second mode.

7. The method for controlling an imaging device according to claim 1,
wherein the determining of whether ambient light includes near-infrared light is made by comparing, with a predetermined threshold, a ratio between an arithmetic mean of a plurality of pixel values included in an image obtained in the first mode and an arithmetic mean of a plurality of pixel values included in an image obtained in the second mode.

8. The method for controlling an imaging device according to claim 6,
wherein the threshold comprises a ratio between a sensitivity of the first mode and a sensitivity of the second mode.

9. A method for controlling an imaging device that has at least a first mode to perform imaging in a first imaging wavelength band and a second mode to perform imaging in a second imaging wavelength band different from the first imaging wavelength band, and that allows switching of an operation mode from the first mode to the second mode or from the second mode to the first mode, the method comprising:
obtaining first image information through imaging performed in the first mode;
obtaining second image information through imaging performed in the second mode;
comparing the first image information with the second image information; and
in accordance with a result of the comparison, selectively maintaining a current operation mode or switching the current operation mode.

10. The method for controlling an imaging device according to claim 1,
wherein the imaging device includes an image sensor,
wherein the imaging in the first mode is performed by using the image sensor, and
wherein the imaging in the second mode is performed by using the image sensor.

11. An imaging device that allows switching of an operation mode between a first mode to perform imaging in a first imaging wavelength band and a second mode to perform imaging in a second imaging wavelength band different from the first imaging wavelength band, the imaging device comprising:
determination circuitry that, based on information obtained in the first mode and information obtained in the second mode, determines whether ambient light includes near-infrared light; and
mode switching circuitry that switches the operation mode to the first mode when the operation mode is the second mode and determination circuitry determines that ambient light includes near-infrared light, and that switches the operation mode to the second mode when the operation mode is the first mode and determination circuitry determines that ambient light does not include near-infrared light.

* * * * *